United States Patent
Suri et al.

(10) Patent No.: US 7,243,039 B1
(45) Date of Patent: Jul. 10, 2007

(54) SYSTEM AND METHOD FOR DETERMINING PROBING LOCATIONS ON IC

(75) Inventors: Hitesh Suri, San Jose, CA (US); Gary Woods, Sunnyvale, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 11/345,004

(22) Filed: Jan. 31, 2006

(51) Int. Cl.
 *G06F 19/00* (2006.01)
(52) U.S. Cl. .......................... 702/117; 700/96
(58) Field of Classification Search ........... 702/117, 702/118; 438/14, 15–18; 700/96–98
 See application file for complete search history.

(56) References Cited

U.S. PATENT DOCUMENTS

| | | | |
|---|---|---|---|
| 6,608,494 B1 | 8/2003 | Bruce et al. | |
| 6,788,093 B2 | 9/2004 | Aitren et al. | |
| 2005/0044514 A1* | 2/2005 | Wu et al. | 716/5 |
| 2006/0076547 A1* | 4/2006 | Lin et al. | 257/1 |
| 2007/0016879 A1* | 1/2007 | Kuo | 716/4 |

OTHER PUBLICATIONS

Desplats, Romain, et. al., "IC Diagnostic with Time Resolved Photon Emission and CAD Auto-channeling," *Proceedings from the 29th International Symposium for Testing and Failure Analysis*, Nov. 2-6, 2003, Santa Clara, California.
"LAVIS: The Future of Layout Viewer," Mar. 2005, Tool Corporation.

* cited by examiner

*Primary Examiner*—Edward Raymond
(74) *Attorney, Agent, or Firm*—Sughrue Mion, PLLC; Joseph Bach

(57) ABSTRACT

A method for identifying an area of a chip to be probed proceeds as follows. A callout list of failures is obtained from a tester, the list including cell name and pin for each failure. A Def file is interrogated to locate a Def entry matching the cell name, and a cell type, cell location, and cell orientation data is obtained for the cell from the Def file. A Lef file is then interrogated to locate a Lef entry matching the cell type, and the coordinates of the pin are obtaining from the Lef file. A GDS file is interrogated to locate a GDS entry matching the cell type, and the coordinates of polygons listed in the GDS entry are obtained. The coordinates of the pin are then crossed with the coordinates of the polygons to identify overlapping area. The overlapping area is defined as the location to be probed. A driving signal is applied to a stage to align a prober with the location to be probed.

19 Claims, 5 Drawing Sheets

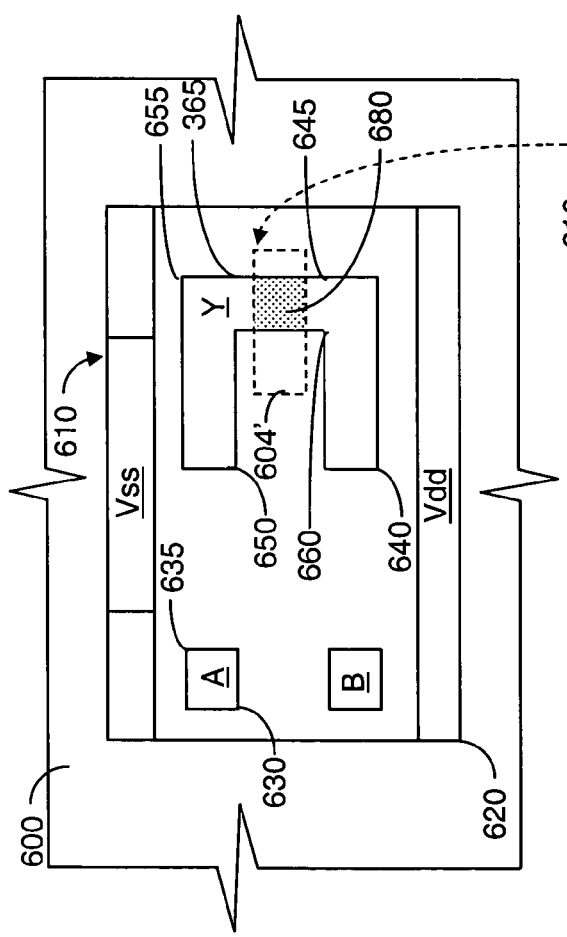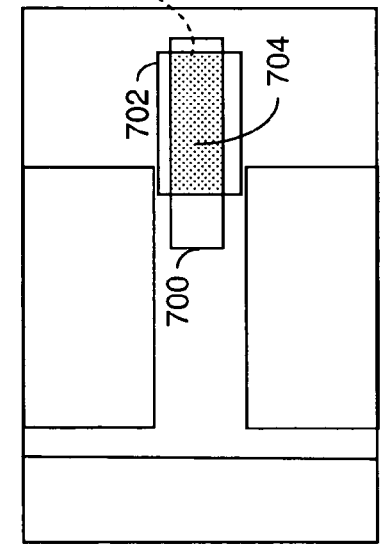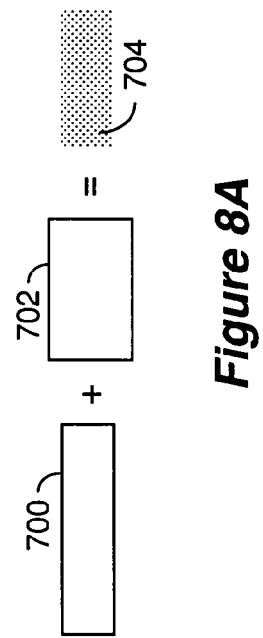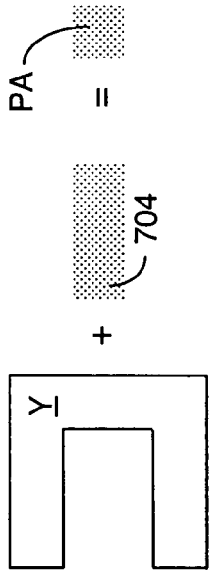
Figure 6
Figure 7
Figure 8A
Figure 8B

SYSTEM AND METHOD FOR DETERMINING PROBING LOCATIONS ON IC

BACKGROUND

1. Field of the Invention

The present invention relates to an apparatus and method for finding exact locations for probing integrated circuits.

2. Description of the Related Art

Probing systems have been used in the art for testing and debugging integrated circuit (IC) designs and layouts. Various laser-based systems for probing IC's are known in the prior art. In these prior art systems, the DUT (device under test) is driven by an electrical test signal, while a laser beam is used to illuminate the DUT. The laser beam then reflects from the DUT, and the reflection is perturbed according to the DUT's response to the electrical test signals. The reflected beam is then converted to an electrical signal having a waveform corresponding to the reflected beam. This waveform is displayed for the user's analysis.

Some of the test and debug technique used in the prior art include LIVA (Light Induced Voltage Alteration), TIVA (Thermally Induced Voltage Alteration), CIVA (Charge Induced Voltage Alteration), XIVA (Externally Induced Voltage Alteration), OBIC (Optical Beam Induced Current), OBHIC (Optical Beam Heat Induced Current), and OBIRCH (Optical Beam Induced Resistance Change). These techniques probe the DUT to detect a change in the characteristics of certain devices or structures therein to thereby detect a failure or an area that is prone to fail or adversely affect the DUT's performance. According to these techniques, the DUT is driven by an electrical signal, while a laser beam is used to illuminate the DUT to thereby cause either heating, carrier generation, or both. As a result, the electrical output from the DUT is perturbed, and this perturbation is detected and analyzed. That is, under these techniques the laser beam is used only as a perturbing agent, but the detection is done by analyzing the electrical output from the DUT.

Other probing techniques are based on the observation that active devices, such as transistors, emit light upon switching of state. In these systems, the DUT is also energized by test vectors, but no light is used to illuminate the DUT. Rather, an optical system is used to collect the faint light that is emitted upon the switching of the transistor being probed. This techniques is generally referred to in the industry as time-resolved emission (TRE) or time-resolved photon emission (TRPE). A system for performing TRPE probing is commercially available under the trade name EmiScope™ from Credence Systems, Inc. of Milpitas, Calif.

As is known in the art, in order to probe the DUT and obtain meaningful analysis, the location of the probed devices must be specified as accurately as possible. This is especially true for TRPE, as the location from which emission emanates is very small, so that accurate placement of the collection optics is imperative for proper emission collection and proper identification of the device that emits the photons.

FIG. 1 is a schematic of prior art method of identifying probing locations on a DUT. In order to test a DUT, first test patterns (also referred to as test vectors) are generated by an automatic test pattern generator, ATPG 105. The test patterns are then fed to the automated testing equipment (also referred to as automated testing and evaluation) ATE 110. The ATE feeds the test vectors to the DUT, 145, and tests the electrical response of the DUT to the test patterns. The ATE then generates a log of fail results, 115, identifying scan chains and test patterns having failures. The log, 115, is then input to an analysis tool, 120, which performs fault simulation using the log so as to determine potential cells or pins that may be faulty. As is shown by the broken-line double arrow, some commercially available ATPG's contain mechanism to also perform the analysis, so while two separate tools are shown, the generation of test vectors and the analysis of the fail log can be done by the same tool. The analysis tool performs fault simulation to determine potential causes for the fault and then outputs a callout log, 125, which lists all of the cell names and related pins that are likely to result in detection of failures.

The cells and pins identified in the callout list may not be the actual cause of the failures. Therefore, it is a practice in the art to use a debug tester, such as a TRPE tool to investigate the actual cause for the fault. For that purpose, the callout log is used to determine which locations to probe with the TRPE tool. That is, using the callout list a debug engineer needs to perform various manual procedures, 150, to determine where to place the prober. The manual procedure involve reviewing various design databases, 130, reviewing the layout vs. schematic, LVS 135, and reviewing layout designs, 140, so as to provide the results, 160, normally in terms of the coordinates of the corner of the cell to be probed.

As can be understood, the methods used in the prior art to arrive at probing locations are tedious and time consuming. Additionally, in most instances only the coordinates of the corner of the cell to be investigated is obtained, and the prober needs to be scanned over the cell to find the actual proper location for probing. Therefore, there is a need in the art for an automated system that provides more detailed information regarding the locations to be probed.

SUMMARY

Various embodiments of the present invention provide apparatus and method for determining the proper locations for probing of a DUT. Other embodiments of the present invention provide apparatus and method for determining the proper locations for probing of a DUT and automatically controlling a stage so that the testing equipment is aligned to the proper location.

According to an aspect of the invention, a method for identifying an area of the chip to be probed proceeds as follows. A callout list of failures is obtained from a tester, the callout list including cell name and pin for each failure. A Def file is interrogated to locate a Def entry matching the cell name, and a cell type, cell location, and cell orientation data is obtained for the cell name from the Def file. A Lef file is then interrogated to locate a Lef entry matching the cell type, and the coordinates of the pin are obtaining from the Lef file. A GDS file is then interrogated to locate a GDS entry matching the cell type, and the coordinates of polygons listed in the GDS entry are obtained. The coordinates of the pin are then crossed with the coordinates of the polygons to identify overlapping area. The overlapping area is defined as the location to be probed.

According to another aspect of the invention, a method for identifying an area of the chip to be probed proceeds as follows. A callout list of failures is obtained from a tester, the callout list including cell name and pin for each failure. A Def file is interrogated to locate a Def entry matching the cell name, and a cell type, cell location, and cell orientation data is obtained for the cell name from the Def file. A Lef file is then interrogated to locate a Lef entry matching the cell type, and the coordinates of the pin are obtaining from the Lef file. A GDS file is then interrogated to locate a GDS entry matching the cell type, and the coordinates of diffusion and poly layer polygons listed in the GDS entry are obtained. The diffusion polygons are crossed with the poly layer polygons to obtain crossed GDS coordinates. The coordinates of the pin are then crossed with the crossed coordinates of the GDS to identify overlapping area. The overlapping area is defined as the location to be probed.

According to another aspect of the invention, a computerized system for determining locations on an integrated circuit microchip to be probed is provided. The system comprising a computer having an input, an output, and a processor. The processor is pre-programmed to perform the steps: a. receive via the input a callout list of failures, the callout list including cell name and pin for each failure; b. interrogate a Def file to locate a Def entry matching the cell name and obtain from the Def entry cell type, cell location, and cell orientation data; c. interrogate a Lef file to locate a Lef entry matching the cell type and obtain from the Lef entry coordinates of the pin; d. interrogate a GDS file to locate a GDS entry matching the cell type and obtain coordinates of polygons listed in the GDS entry; e. perform a Boolean operation on the coordinates of the pin with the coordinates of the polygons to identify overlapping area; and f. output the overlapping area as the location to be probed.

According to yet another aspect of the invention, the computer is pre-programmed to perform the steps: d1. obtain coordinates of diffusion layer polygons and coordinates of poly layer polygons from the GDS entry; and, d2. cross the coordinates of the diffusion layer polygons and the coordinates of the poly layer polygons to thereby obtained coordinates of crossed GDS polygon; and step e comprises perform a Boolean operation on the coordinates of the pin with the coordinates of the crossed GDS polygon to identify overlapping area.

According to still another aspect of the invention, a computerized system for determining locations on an integrated circuit microchip to be probed and controlling a stage to place a prober at the proper location is provided. The system comprising a computer having an input, an output, and a processor. The processor is pre-programmed to perform the steps: a. receive via the input a callout list of failures, the callout list including cell name and pin for each failure; b. interrogate a Def file to locate a Def entry matching the cell name and obtain from the Def entry cell type, cell location, and cell orientation data; c. interrogate a Lef file to locate a Lef entry matching the cell type and obtain from the Lef entry coordinates of the pin; d. interrogate a GDS file to locate a GDS entry matching the cell type and obtain coordinates of polygons listed in the GDS entry; and e. determine from the interrogated files the proper location on the microchip to be probed. The system then provides an output to control the motion of a stage so as to align the prober with the location on the microchip.

Other aspects and features of the invention will become apparent from the description of various embodiments described herein, and which come within the scope and spirit of the invention as claimed in the appended claims.

BRIEF DESCRIPTION OF THE DRAWINGS

FIG. 6 is a schematic of a section of a die illustrating another embodiment of the subject invention.

FIG. 7 depicts a fictitious diffusion layer and a fictitious poly layer corresponding to the die of FIG. 6.

FIGS. 8A and 8B depicts the two step process for crossing the diffusion layer with the poly layer using the GDS II data, and then crossing the result with the pin area obtained from the Lef file.

Figure 1:
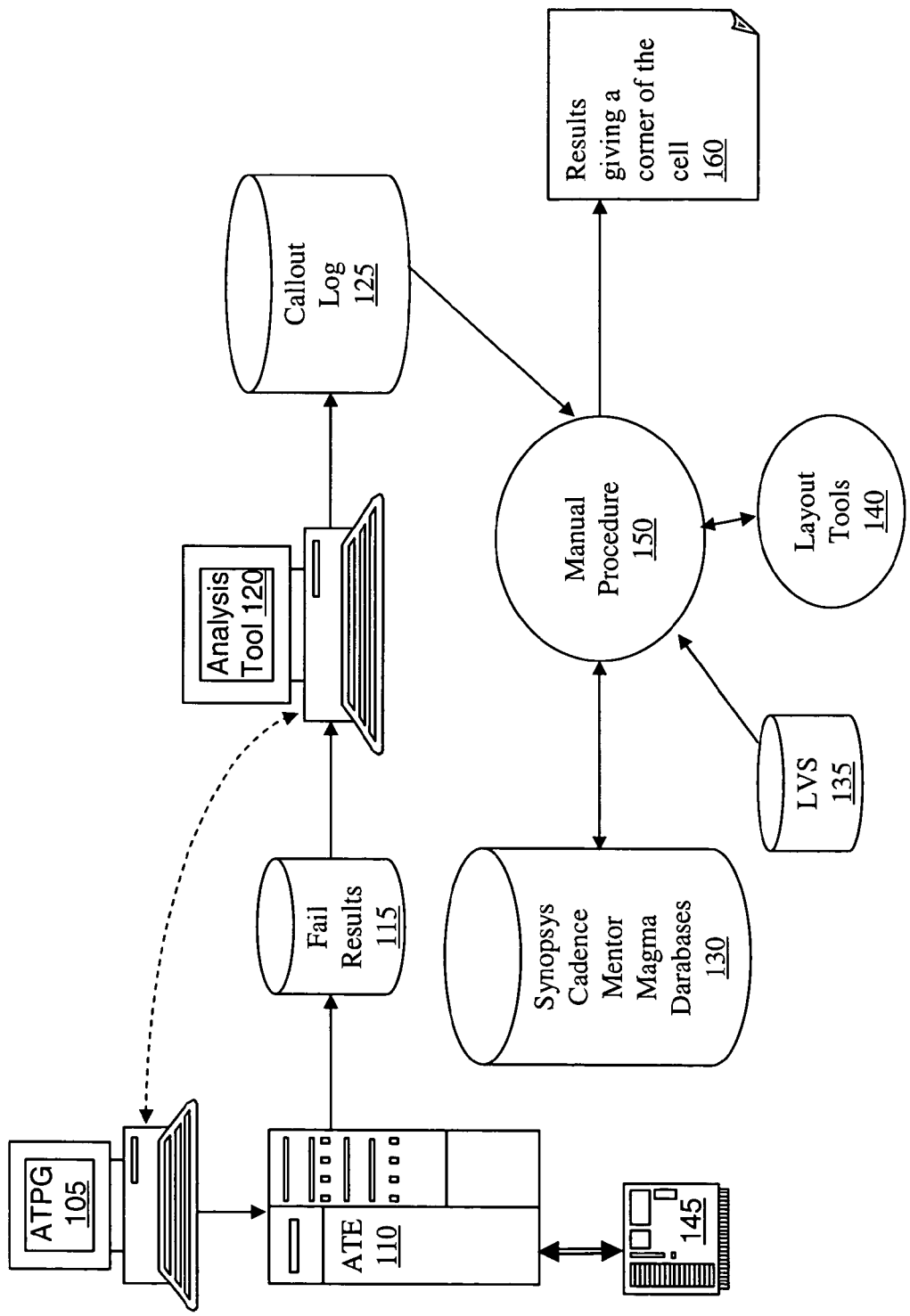
FIG. 1 is a general schematic depicting procedures according to the prior art.

The invention is described herein with reference to particular embodiments thereof, which are exemplified in the drawings. It should be understood, however, that the various embodiments depicted in the drawings are only exemplary and may not limit the invention as defined in the appended claims.

DETAILED DESCRIPTION

Figure 2:
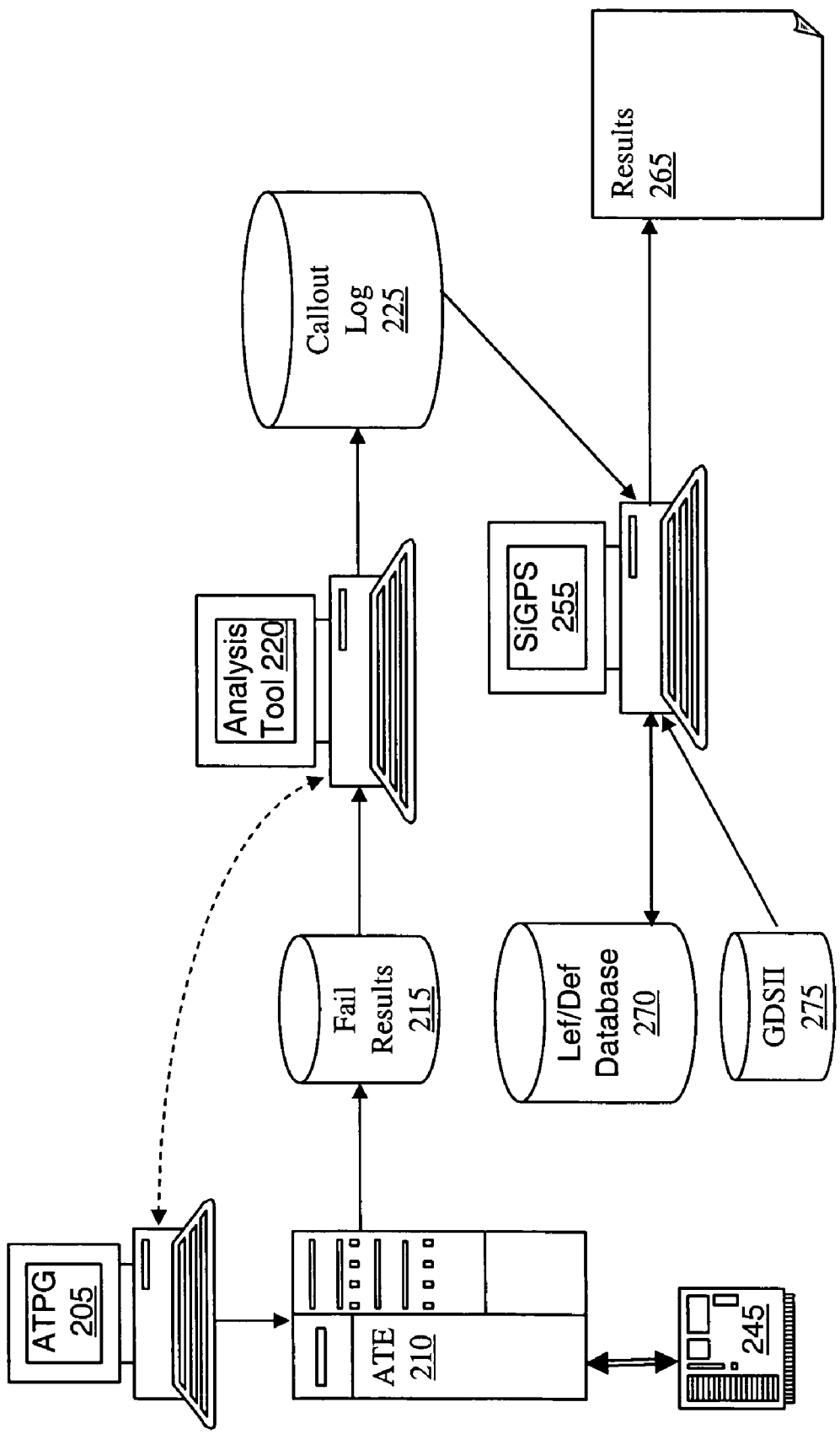
FIG. 2 is a diagram illustrating a first embodiment of the present invention.

FIG. 2 depicts an embodiment of the present invention. In this embodiment, all of the equipment and processes leading to the generation of the callout log 225 are the same as in the prior art. However, according to this embodiment, The Def/Lef and GDSII files are interrogated to produce the results of locations for probing, providing the bounding box of the cell, the pins, and the locations within the cell where TRE probing may be performed. This process is referred to herein as SiGPS and may be done automatically using a specifically programmed computer, such as a PC.

The terms Lef, Def, and GDS are commonly used in the art. The term Lef is an acronym for Library Exchange Format and is a file that defines the cell design, akin to a "real estate" layout of each cell within the chip. The Lef file lists the size, type, and location of each pin within each cell. The term Def is an acronym for Design Exchange Format and is a file that defines the layout of the various cells within the chip, akin to a "global real estate" layout for the chip. The Def file lists the coordinates, orientation, type, and routing for each cell within the chip. As can be understood, together the Lef/Del files provide the information for locating every cell within the chip and every pin within each cell, however, these files provide no transistor level information.

The GDS II is the industry standard for mask layout interchange format. The GDS II file has root for each type of cell, e.g., AND gate, OR gate, etc., which defines the structure of the cell. For example, boundary defines a filled polygon while a path defines a wire. The GDS 11 file also has references, which invokes cells or cell arrays and defines their locations. The GDS II formats defines all cells and cell locations, but does not include the cell names.

As is known in the art, the callout log, 225, lists cell names, but not their locations. Additionally, the callout log names the specific pin where a failure has been detected; however, for TRE probing one needs to know the diffusion location since the emission comes from the diffusion area, not from the pin. The following embodiment of the present invention illustrates how a computer may be used to identify the proper diffusion location for TRE probing.

For illustration, the description of the embodiment proceeds with respect to a fictitious callout line, illustrated as:

myand Y

"myand" illustrates the field for a specific gate; and "Y" illustrates the field for the specific pin indicating a failure. According to this embodiment, the entry in the field for the cell name is matched with the list of cell names in the Def files, 270. When a match is found, the type, location, and orientation of the cell are extracted from the Def file. For example, the Def entry for the cell may be:

myand AND2X1 (100,100) N wherein "myand" is the entry in the field for the cell name, "AND2X1" is the entry in the filed for the cell type (e.g. and AND gate with 2 inputs and 1 output), "(100,100)" is the entry in the field for the cell location (here, what is given are the coordinate for the corner of the cell within the die), and "N" is the entry in the field for the cell's orientation within the die (e.g., North). Consequently, at this point the system possess an identification of the cell's location within the die, the cell's orientation, and the cell type.

For further illustration, another illustration of a hierarchical design (having multiple DEF Files) is provided as:

Top/mycounter/AND128 Y wherein "Top" illustrates the field for an upper-level cell; "mycounter" illustrates the field for a specific cell; "AND128" illustrates the field for a specific gate; and "Y" illustrates the field for the specific pin indicating a failure. "Top" is defined in one Def file which is searched for location, celltype and orientation of an instance matching "mycounter". When a match is found, the type, location, and orientation of the cell are extracted from the Def file. For example, the Def entry for the cell may be:

mycounter COUNTER 500,500 FS wherein "mycounter" is the entry in the field for the cell name, "COUNTER" is the entry in the filed for the cell type (e.g. a counter block), "(500,500)" is the entry in the field for the cell location (here, what is given are the coordinate for the corner of the cell within the cell "Top"), and "FS" is the entry in the field for the cell's orientation within the cell "Top" (e.g., Flip South).

Now the Def file containing the definition of "COUNTER" is searched for the entry matching "AND128". According to this embodiment, the entry in the field for the cell name is matched with the list of cell names in the Def files, 270. When a match is found, the type, location, and orientation of the cell are extracted from the Def file. For example, the Def entry for the cell may be:

AND128 AND2X1 (100,100) N wherein "AND128" is the entry in the field for the cell name, "AND2X1" is the entry in the filed for the cell type (e.g. and AND gate with 2 inputs and 1 output), "(100,100)" is the entry in the field for the cell location (here, what is given are the coordinate for the corner of the cell within the cell "mycounter"), and "N" is the entry in the field for the cell's orientation within the cell "mycounter" (e.g., North). Consequently, at this point the system possess an identification of the cell's location within the die, the cell's orientation, and the cell type.

Absolute coordinates of the cell top/mycounter/AND128 are calculated after performing the rotations (FS for mycounter and N for AND128) and applying offset.

The system then queries the Lef files, 270, for a cell type that matches the cell type obtained from the Def file. When a corresponding cell type is found in the Lef files, the system fetches the location data of the specific pin indicated in the callout list. Consequently, at this point the system possess an identification of the cell's location within the die (from Def), the cell's orientation (from Def), and the location within the cell of the specific pin (from Lef).

However, as indicated above, the emission naturally occurs within the diffusion layer. Therefore, the system needs to identify the location of the diffusion corresponding to the indicated pin. To obtain this information the system queries the GDS 11 files, 275. The GDS II files do not contain cell names or pin names. However, the GDS II files have information relating to layout and placement of standard cell types. Therefore, the system queries the GDS II for a cell type that matches the cell type obtained from the Def files. Once a match is found, the system crosses the GDS's diffusion areas for that cell type with the coordinates of the pin obtained from the Lef files. When an area is found to be overlapping, it is indicated as the location to be probed. Consequently, at this point the system possess an identification of the cell's location within the die (from Def), the cell's orientation (from Def), and the location within the cell of a diffusion layer that corresponds to the specific pin (from crossing GDS II and pin polygons). This information is provided as result 265, to indicate the proper place for placing the probe for the emission test.

Figures 3, 4, 5:
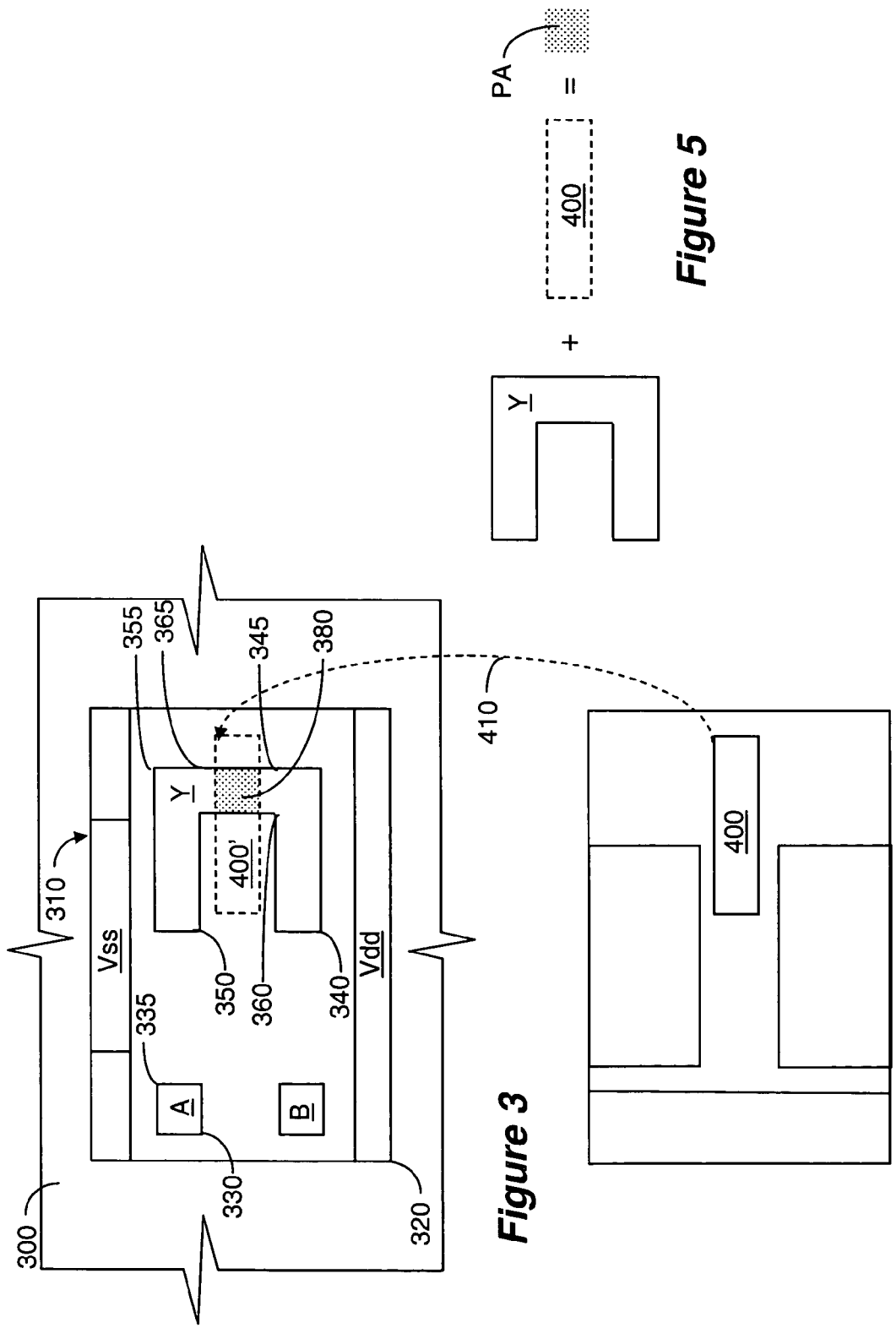
FIG. 3 is a schematic of a section of a die illustrating an embodiment of the subject invention.
FIG. 4 is an illustration of fictitious diffusion areas stored in the GDS II files for the cell shown in FIG. 3.
FIG. 5 depicts a cross operation, wherein pin Y is crossed with diffusion area 400, resulting in probing area PA.

FIG. 3 is a schematic of a section of a die illustrating an embodiment of the subject invention. A section of the die is shown at 300, and includes cell 310. The Def files for this chip include the name of cell 310, the coordinate of corner 320 of the cell within the die 300 and the orientation of the cell within the die 300. Therefore, using the name of the cell, the inventive system uses the Def file to find the corner 320 and orientation of the cell. As is shown in this example, this cell includes contacts labeled Vss, Vdd, A, B, and Y. In this embodiment, the Lef files are queries using the cell type obtained from the Def files. The Lef files for this chip would have a list of corner coordinates for all contacts of this cell type. For example, for contact A, the Lef files will include the coordinates of corners 330 and 335. However, since using two coordinates one can only construct a rectangle, the coordinates for a more complex shape are provided in the form of multiple rectangle corners. For example, for pin Y, the coordinates would be for three rectangles. Thus, for pin Y, the coordinates may be (340,345), (350,355), and (360, 365), indicating three rectangles that together form the pin Y.

FIG. 4 is an illustration of fictitious diffusion areas stored in the GDS II files for the cell shown in FIG. 3. The coordinates of the various diffusion polygons are obtained from the GDS II files using the type of cell obtained from the Def files. The coordinates of the polygons from the GDS II files are crossed with the coordinates of the rectangles of the pin Y from the callout log, using the coordinates obtained from the Lef file. As illustrated in FIGS. 3 and 4, when polygon 400 is crossed with the rectangles of pin Y—as schematically illustrated by broken-line arrow 410 and broken-line rectangle 400', dotted area 380 is found to be overlapping. This is the area where diffusion and pin contact are overlapping and is the area where emission is likely to be found. Therefore, the coordinates of this area are issued by the inventive system as the location to place the probe. FIG. 5 depicts this cross operation, wherein pin Y is crossed with diffusion area 400, resulting in probing area PA.

FIG. 6 is a schematic of a section of a die illustrating another embodiment of the subject invention. FIG. 6 depicts an example that is similar to the embodiment shown in FIG. 3. However, here the operation for finding the location to be probed is a two-tiered operation. In general, the diffusion layer is much larger than the active area where photon emission occurs. Therefore, it is advantageous to further delineate the area for testing to be as limited as possible to active areas. To accomplish that, in a first step two layers from the GDS II are crossed so as to obtain an area that is limited to the active areas. Then, the result is crossed with the coordinates of the pin layer, Y, obtained from the Lef file. In this manner, the area to be inspected is delimitated to include the active area that is below the failed pin.

The first step is shown in FIG. 7, wherein a fictitious diffusion layer 700 and a fictitious poly layer 702 are illustrated. In the first step the area of the diffusion layer 700 is crossed with the area of the poly layer 702 to obtained the overlapping area 704. By crossing the diffusion layer with the poly layer, the resulting area is limited to active section of the transistor. The result is then crossed with the pin area, as shown in FIG. 6, wherein area 604' is crossed with pin Y to result in area 680. This is also illustrated in FIGS. 8A and 8B, wherein FIG. 8A illustrate the first step of crossing the area 700 of the diffusion layer with area 702 of the poly layer to obtain area 704. FIG. 8B illustrates crossing area 704 which was obtained from crossing the GDS II data, with the area of pin Y, which was obtained from the Lef files, to result in area PA for placing the probe.

To illustrate, in order to delineate probing area in an NMOS transistor, in the first step an AND operation is performed using the polygons of the poly and the N-diffusion layers obtained from the GDS II files. The result is then used to perform an AND operation with the polygon of the pin from the Lef files. This delineates an area that is most likely to result in photon emission corresponding to the pin in an NMOS transistor. For a PMOS transistor the polygons for the poly and the p-diffusion layers are crossed, and the result is crossed with the pin polygon. This results in a probing area that is most likely to result in photo emission from a PMOS transistor.

Figure 9:
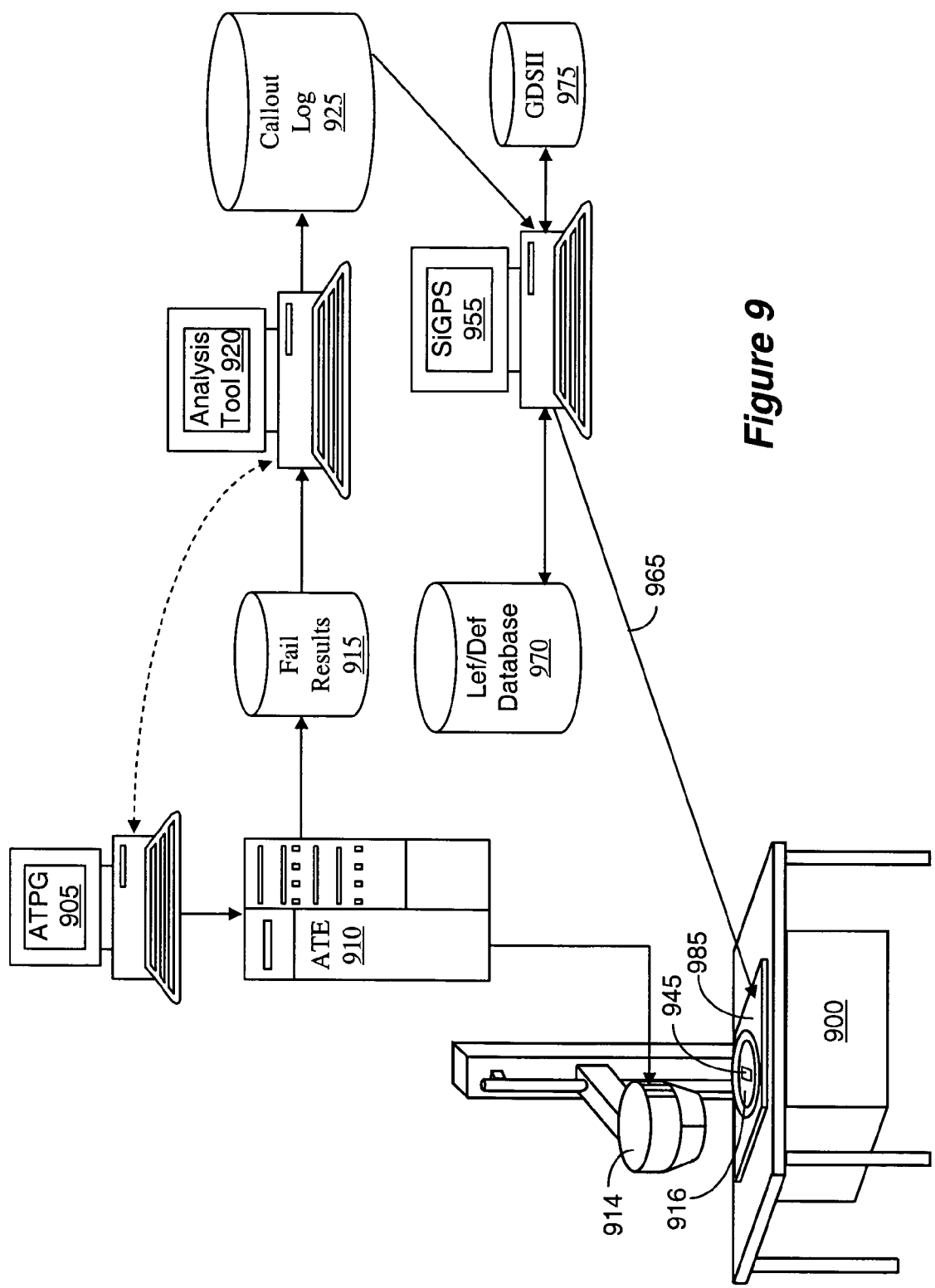
FIG. 9 is a diagram illustrating another embodiment of the present invention.

FIG. 9 depicts another embodiment of the present invention. According to this embodiment, a system and method are provided to enable automatic alignment of a prober, 900, to a proper location on the DUT, 945, for investigation. As shown, ATE 910 provides the test vectors to the tester head 914. The tester head applies the test vectors to the DUT 945 via adapter 916. The prober 900 may be any of the prober mentioned above, such as LIVA, TUVA, emission testers, etc. An x-y stage is provided so that the prober can be properly aligned to a desired location on the DUT. The fail result is sent out from the ATE 910 as in the previous embodiments and the SiGPS 955 interrogates the Lef/Def files 970 and the GDSII files 975 so as to determine the locations on the DUT that should be probed by prober 900, using any of the above described methods. When the SiGPS 955 determines a location on the DUT to be probed, the SiGPS sends driving signals 965 to the x-y stage so that the prober is aligned with the location on the DUT to be probed. Generally, there are two ways of accomplishing the alignment by the stage: 1. the DUT is connected to the stage so that the stage moved the DUT to be aligned with the prober, or 2. the DUT is stationary and the prober is movable by the stage. The end result, however, is the same: to align the probing axis of the prober with the location on the DUT to be probed. For example, when the prober is an optical tester, e.g., emission microscope, the probing axis is the optical axis of the collection optics.

While the invention has been described with reference to particular embodiments thereof, it is not limited to those embodiments. Specifically, various variations and modifications may be implemented by those of ordinary skill in the art without departing from the invention's spirit and scope, as defined by the appended claims.

What is claimed is:

1. A method for determining locations on an integrated circuit microchip to be probed, comprising:
   a. receiving a callout list of failures from a tester, said callout list including cell name and pin for each failure;
   b. interrogating a Def file to locate a Def entry matching said cell name and obtaining from said Def entry cell type, cell location, and cell orientation data;
   c. interrogating a Lef file to locate a Lef entry matching said cell type and obtaining from said Lef entry coordinates of said pin;
   d. interrogating a GDS file to locate a GDS entry matching said cell type and obtaining coordinates of polygons listed in said GDS entry;
   e. crossing the coordinates of said pin with the coordinates of said polygons to identify overlapping area;
   f. defining said overlapping area as the location to be probed.

2. The method of claim 1, wherein step d further comprises:
   d1. obtaining coordinates of diffusion layer polygons and coordinates of poly layer polygons from said GDS entry; and,
   d2. crossing the coordinates of said diffusion layer polygons and the coordinates of said poly layer polygons to thereby obtained coordinates of crossed GDS polygon;
   and wherein the step e of crossing the coordinates of said pin with the coordinates of said polygons comprises crossing the coordinates of said pin with the coordinates of said crossed GDS polygon.

3. A computerized system for determining locations on an integrated circuit microchip to be probed, comprising:
   a computer having an input, an output, and a processor; the processor pre-programmed to perform the step:
   a. receive via the input a callout list of failures, said callout list including cell name and pin for each failure;
   b. interrogate a Def file to locate a Def entry matching said cell name and obtain from said Def entry cell type, cell location, and cell orientation data;
   c. interrogate a Lef file to locate a Lef entry matching said cell type and obtain from said Lef entry coordinates of said pin;
   d. interrogate a GDS file to locate a GDS entry matching said cell type and obtain coordinates of polygons listed in said GDS entry;
   e. perform a Boolean operation on the coordinates of said pin with the coordinates of said polygons to identify overlapping area;
   f. output said overlapping area as the location to be probed.

4. The computerized system of claim 3, wherein the computer is pre-programmed to perform the steps:
   d1. obtain coordinates of diffusion layer polygons and coordinates of poly layer polygons from said GDS entry; and,
   d2. cross the coordinates of said diffusion layer polygons and the coordinates of said poly layer polygons to thereby obtained coordinates of crossed GDS polygon;
   and wherein the step e comprises perform a Boolean operation on the coordinates of said pin with the coordinates of said crossed GDS polygon to identify overlapping area.

5. The computerized system of claim 4, wherein said Boolean operation is an AND operation.

6. A computerized system for determining locations on an integrated circuit microchip to be probed and controlling a stage to place a prober at the proper location, comprising:
   a computer having an input, an output, and a processor, the processor pre-programmed to perform the steps:
   a. receive via the input a callout list of failures, the callout list including cell name and pin for each failure;
   b. interrogate a Def file to locate a Def entry matching the cell name and obtain from the Def entry cell type, cell location, and cell orientation data;
   c. interrogate a Lef file to locate a Lef entry matching the cell type and obtain from the Lef entry coordinates of the pin;
   d. interrogate a GDS file to locate a GDS entry matching the cell type and obtain coordinates of polygons listed in the GDS entry;
   e. determine from the interrogated files the proper location on the microchip to be probed;
   f. output via said output driving signal to control the motion of the stage so as to align the prober with the location on the microchip.

7. The computerized system of claim 6, wherein step d comprises:
   d1. perform a Boolean operation on the coordinates of said pin with the coordinates of said polygons to identify overlapping area and define said overlapping area as the location to be probed.

8. The computerized system of claim 7, wherein step d1 comprises:
   di. obtain coordinates of diffusion layer polygons and coordinates of poly layer polygons from said GDS entry; and,
   dii. cross the coordinates of said diffusion layer polygons and the coordinates of said poly layer polygons to thereby obtained coordinates of crossed GDS polygon; and
   cross the coordinates of said pin with the coordinates of said crossed GDS polygon.

9. The computerized system of claim 6, wherein step e comprises:
   e1. perform a Boolean operation on the coordinates of said pin with the coordinates of said polygons to identify overlapping area; and define the overlapping area as the location to be probed.

10. The computerized system of claim 9, wherein step d comprises:
    d1. obtain coordinates of diffusion layer polygons and coordinates of poly layer polygons from said GDS entry; and,
    d2. cross the coordinates of said diffusion layer polygons and the coordinates of said poly layer polygons to thereby obtained coordinates of crossed GDS polygon; and wherein the step e comprises perform a Boolean operation on the coordinates of said pin with the coordinates of said crossed GDS polygon to identify overlapping area.

11. The computerized system of claim 9, wherein said Boolean operation is an AND operation.

12. A system for probing a microchip device under test (DUT), comprising:
    an adapter for mounting the DUT thereupon;
    a prober having probing axis;
    a movable stage providing relative motion between the DUT and the prober so as to align the probing axis with selected locations on the DUT;
    a controller having an input and an output, and controlling the prober and the stage, said controller performing the operations comprising:
    a. receive via the input a callout list of failures, the callout list including cell name and pin for each failure;
    b. interrogate a Def file to locate a Def entry matching the cell name and obtain from the Def entry cell type, cell location, and cell orientation data;
    c. interrogate a Lef file to locate a Lef entry matching the cell type and obtain from the Lef entry coordinates of the pin;
    d. interrogate a GDS file to locate a GDS entry matching the cell type and obtain coordinates of polygons listed in the GDS entry;
    e. determine from the interrogated files the proper location on the microchip to be probed;
    f. output via said output driving signal to control the motion of the stage so as to align the probing axis with selected locations on the DUT.

13. The computerized system of claim 12, wherein operation d comprises:
    d1. perform a Boolean operation on the coordinates of said pin with the coordinates of said polygons to identify overlapping area and define said overlapping area as the location to be probed.

14. The computerized system of claim 13, wherein operation d1 comprises:
    di. obtain coordinates of diffusion layer polygons and coordinates of poly layer polygons from said GDS entry; and,
    dii. cross the coordinates of said diffusion layer polygons and the coordinates of said poly layer polygons to thereby obtained coordinates of crossed GDS polygon; and
    cross the coordinates of said pin with the coordinates of said crossed GDS polygon.

15. The computerized system of claim 12, wherein operation e comprises:
    e1. perform a Boolean operation on the coordinates of said pin with the coordinates of said polygons to identify overlapping area; and define the overlapping area as the location to be probed.

16. The computerized system of claim 15, wherein operation d comprises:
    d1. obtain coordinates of diffusion layer polygons and coordinates of poly layer polygons from said GDS entry; and,
    d2. cross the coordinates of said diffusion layer polygons and the coordinates of said poly layer polygons to thereby obtained coordinates of crossed GDS polygon; and wherein the step e comprises perform a Boolean operation on the coordinates of said pin with the coordinates of said crossed GDS polygon to identify overlapping area.

17. The computerized system of claim 15, wherein said Boolean operation is an AND operation.

18. A method for determining locations on an integrated circuit microchip to be probed, comprising:
    a. receiving instance name of a cell to be probed;
    b. interrogating Def file to locate Def entry matching said instance name and obtaining cell location from said Def entry;
    c. providing driving signal to a prober stage to drive the prober stage to the cell location for probing.

19. A method for determining locations on an integrated circuit microchip to be probed, comprising:

a receiving instance name of a pin to be probed
b interrogating Def file to locate Def entry matching said instance name and obtaining cell location and cell type from said Def entry;
c interrogating LEF file to locate Lef entry matching the cell type and within the cell type a pin type;
d. calculating the pin location with respect to the integrated circuit;
e. providing driving signal to a prober stage to drive the prober stage to the pin location for probing.

* * * * *